United States Patent

Kobayashi

[11] Patent Number: 5,825,709
[45] Date of Patent: Oct. 20, 1998

[54] SEMICONDUCTOR MEMORY DEVICE

[75] Inventor: Masakazu Kobayashi, Osaka, Japan

[73] Assignee: Sharp Kabushiki Kaisha, Osaka, Japan

[21] Appl. No.: 783,032

[22] Filed: Jan. 14, 1997

[30] Foreign Application Priority Data

Jan. 19, 1996 [JP] Japan .................................. 8-007868

[51] Int. Cl.[6] .................................................. G11C 8/00
[52] U.S. Cl. ................................ 365/230.03; 365/230.04; 365/238.5; 365/205
[58] Field of Search ........................ 365/230.03, 230.04, 365/238.5, 205, 189.05

[56] References Cited

U.S. PATENT DOCUMENTS

| | | | |
|---|---|---|---|
| 4,800,530 | 1/1989 | Itoh et al. | 365/230.04 |
| 5,257,235 | 10/1993 | Miyamoto | 365/230.03 |
| 5,276,650 | 1/1994 | Kubota | 365/230.04 X |
| 5,331,600 | 7/1994 | Higuchi | 365/230.04 |
| 5,519,655 | 5/1996 | Greenberg | 365/230.04 X |
| 5,619,473 | 4/1997 | Hotta | 365/238.5 |
| 5,642,322 | 6/1997 | Yoneda | 365/230.03 |
| 5,654,932 | 8/1997 | Rao | 365/230.03 |

FOREIGN PATENT DOCUMENTS

| | | |
|---|---|---|
| 1-199398 | 8/1989 | Japan . |
| 5-144255 | 6/1993 | Japan . |

*Primary Examiner*—Huan Hoang
*Attorney, Agent, or Firm*—Morrison & Foerster, LLP

[57] ABSTRACT

A semiconductor memory device of this invention includes: a memory cell array including a plurality of bit blocks each including a plurality of bit line groups each including a plurality of bit lines; a row decoder for designating a row over the plurality of bit blocks based on a row address so that data stored in memory cells on the designated row is read out to bit lines corresponding to the memory cells; a column decoder for designating a plurality of the bit lines each belonging to different one of the bit line groups based on a column address; a plurality of sense amplifiers each provided for one of the plurality of bit line groups for sensing and amplifying data on the designated bit lines; a plurality of latch circuits each provided for one of the plurality of sense amplifiers for latching outputs of the plurality of sense amplifiers; and a selector for alternately selecting one of outputs of the plurality of latch circuits corresponding to different bit line groups, thereby rapidly outputting the data.

5 Claims, 7 Drawing Sheets

SEMICONDUCTOR MEMORY DEVICE

BACKGROUND OF THE INVENTION

1. Field of the Invention

The present invention relates to a semiconductor memory device including a plurality of memory cells arranged in a matrix, where each memory cell is accessed by addressing a row address and a column address.

2. Description of the Related Art

Operation speed of microprocessors and the like has increased in recent years. Accordingly, there has been a growing demand for a high-speed semiconductor memory. Although it is important to increase the access speed of an ordinary random access operation, the access speed is physically limited. Therefore, it has been proposed to realize a rapid read-out operation for successively-addressed data.

For example, Japanese Laid-Open Patent Publication No. 1-199398 discloses a semiconductor memory device as shown in FIG. 5. The semiconductor memory device has a memory cell array which is divided into four blocks 11. Each block 11 includes a row decoder 12, a column decoder 13 and two small blocks 14. The row decoder 12 and the column decoder 13 are provided commonly for the two small blocks 14. Each small block 14 is also provided with a sense amplifier 15 which is selectively connected to one bit line by the column decoder 13, and a latch circuit 16 for latching data sensed by the sense amplifier 15. The output of the latch circuit 16 of each small block 14 is connected to a common data line via a selection transistor 17. Output signals from the latch circuit 16 are transmitted to an output buffer 18.

Once a row address and a column address are determined in the semiconductor memory device, one memory cell is designated for each small block 14 by the row decoder 12 and the column decoder 13. An 8-bit data stored in the designated memory cells is read out to the bit lines, sensed by the sense amplifiers 15, and then latched by the latch circuits 16. Then, a block selection signal BS0, for example, is activated so that the selection transistor 17 of the leftmost small block 14 in FIG. 5 is turned on. Thus, a bit of the 8-bit data latched by the latch circuit 16 is output to an external circuit via the output buffer 18. Next, a block selection signal BS1 is activated so that another bit of the 8-bit data latched by the latch circuit 16 of the next small block 14 is output to an external circuit. Similarly, the other bits of the 8-bit data can be successively output by successively activating other block selection signals BS2 to BS7.

In such a semiconductor memory device, the first bit of data is output after all the bits of the 8-bit data on the bit line are sensed by the sense amplifiers 15, which requires a relatively long period of time as for an ordinary random access operation. However, the second to eighth bits of the data are already sensed when the first bit of the data is sensed. Therefore, these bits of the data can be successively and rapidly output only by successively activating selection transistors 17.

Japanese Laid-Open Patent Publication No. 5-144255 discloses a semiconductor memory device as shown in FIG. 6. The semiconductor memory device rapidly reads out data by pages of data each composed of 8 bits which are successively addressed by lower 3 bits A0 to A2 of an address data. The upper bits A3 to A19 of the address data are supplied to a decoder 21 so that the 8-bit page data stored in corresponding addresses in a memory cell array 22 is read out, and sensed by a sense amplifier group 23. When the upper bits A3 to A19 of the address data are altered to the next, the alteration is detected by an address transition detection circuit 24, which then transmits a latch signal φLATCH to a latch circuit group 25 so that the latch circuit group 25 latches the 8-bit page data sensed by the sense amplifier group 23. The lower 3 bits A0 to A2 of the address data are supplied to a page mode decoder 26 so as to turn on one of transistors in a selector 27. Thus, one bit of the 8-bit data latched by the latch circuit 25 is output to an output pad 29 via an output buffer 28.

In such a semiconductor memory device, the upper bits A3 to A19 of the address data designating address a, for example, are supplied to the decoder 21 so that an 8-bit page data stored in address a of the memory cell array 22 is read out, and sensed by the sense amplifier group 23. The upper bits A3 to A19 of the address data are then altered to designate address b so that the address transition detection circuit 24 outputs an active (L level) latch signal φLATCH as shown in FIG. 7. Thus, the 8-bit page data sensed by the sense amplifier group 23 is latched by the latch circuit group 25. The lower 3 bits A0 to A2 of the address data are then successively altered so that the 8 bits of the page data latched by the latch circuit group 25 are successively output via the selector 27 and the output buffer 28. While outputting the first 8-bit page data, the next 8-bit page data stored in address b of the memory cell array 22 is read out, and sensed by the sense amplifier group 23. The upper bits A3 to A19 of the address data are altered to designate address c after the page data from address a is output, so that the page data from address b is latched by the latch circuit group 25. Pages of data stored in subsequent addresses can also be successively output in the same manner.

Such a semiconductor memory device requires a relatively long period of time as for an ordinary random access operation to complete sensing the first 8-bit page data stored in address a after being designated by the upper bits A3 to A19 of the address data. However, once the sense amplifier group 23 completes sensing the first page of data and the upper bits A3 to A19 of the address data are altered to designate the next address b, the 8-bit page data from address a can be successively and rapidly output only by successively altering the lower 3 bits A0 to A2 of the address data. Moreover, subsequent pages of data from address b, c and so forth can also be output successively only with a short interval between bits.

Now, the problems of the conventional semiconductor memory devices shown in FIGS. 5 and 6 will be described.

In accordance with the semiconductor memory device shown in FIG. 5, the number of bits of data which can be successively and rapidly read out is limited to the number (eight in the above example) of small blocks 14 included in the memory cell array. The operation speed of such a semiconductor memory device cannot be enhanced to a sufficient level in the case where a large amount of data must be successively read out.

In accordance with the semiconductor memory device shown in FIG. 6, the sense amplifier group 23 and the latch circuit group 25 are required for outputting 1-bit data. These circuit groups 23 and 25 respectively include a large number (eight in the above example) of sense amplifiers and latch circuits. Therefore, in order to output 8-bit data in parallel, for example, eight circuits each having such a configuration are required. As a result, the scale of the circuit becomes excessively large.

SUMMARY OF THE INVENTION

According to one aspect of this invention, a semiconductor memory device includes: a memory cell array including a plurality of bit blocks each including a plurality of bit line groups each including a plurality of bit lines; a row decoder for designating a row over the plurality of bit blocks based on a row address so that data stored in memory cells on the designated row is read out to bit lines corresponding to the memory cells; a column decoder for designating a plurality of the bit lines each belonging to different one of the bit line groups based on a column address; a plurality of sense amplifiers each provided for one of the plurality of bit line groups for sensing and amplifying data on the designated bit lines; a plurality of latch circuits each provided for one of the plurality of sense amplifiers for latching outputs of the plurality of sense amplifiers; and a selector for alternately selecting one of outputs of the plurality of latch circuits corresponding to different bit line groups, thereby rapidly outputting the data.

In one embodiment of the invention, the column decoder alternately designates a plurality of the bit lines each belonging to different one of the bit line groups for each of the bit blocks based on the column address while the row decoder maintains the designation of the row over the plurality of bit blocks based on the row address; and the selector alternately selects one of outputs of the plurality of latch circuits corresponding to different bit line groups.

In another embodiment of the invention, while the sense amplifiers sense the data on the bit line designated by the column decoder, the bit lines belonging to the bit line group which is not the bit line group to which the designated bit line belongs is precharged.

In still another embodiment of the invention, the plurality of bit line groups include an even-numbered bit line group and an odd-numbered bit line group.

Hereinafter, the function of the present invention will be described.

Once a row address (X address) and a column address (Y address) are determined, a row decoder designates a row over a plurality of bit blocks based on the row address, and a column decoder designates bit lines each belonging to one of different bit line groups (e.g., an even-numbered bit line group and an odd-numbered bit line group) for each bit block. Data on the selected bit lines is sensed by sense amplifiers each provided for one of the bit line groups (e.g., a sense amplifier for the even-numbered bit line group and another for the odd-numbered bit line group), and latched by latch circuits each corresponding to one of the sense amplifiers. A selector selects one of the bit line groups (e.g., the even-numbered bit line group) so that the data (e.g., column 0 of the even-numbered bit line group) latched by the latch circuit of the selected bit line group is output. When the column address is altered to the next, the selector selects the latch circuit of the other bit line group (e.g., the odd-numbered bit line group), which is not the previously-selected bit line group (e.g., the even-numbered bit line group), and the data (e.g., column 1 of the odd-numbered bit line group) is output. Thus, the period of time required for sensing data is saved, thereby enhancing the read-out speed.

When the column address is further altered to the next, the column decoder designates the next bit line (e.g., column 2 of the even-numbered bit line group). Since the bit line is not the previously-designated bit line (e.g., column 0 of the even-numbered bit line group), the sense amplifier (e.g., belonging to the even-numbered bit line group) can start sensing data on the newly-designated bit line (e.g., column 2). Therefore, once the column address is altered to the next, the sense amplifiers are always allowed to start sensing data which is to be output after the oncoming output, thereby enhancing the read-out speed.

Moreover, each bit line is not provided with a large number of sense amplifiers. Only sense amplifiers of the number of the bit line groups are provided for each bit block and used alternately (i.e., by turns). Therefore, the circuit scale can be minimized while the number of sense amplifiers functioning at the same time is also minimized.

Furthermore, due to such a configuration, it is possible to successively output data while maintaining the selection of the row of bit blocks over alterations of column address.

Moreover, due to such a configuration, while data on one bit line is being sensed, other bit lines can be precharged. Thus, the period of time required for precharging bit lines is saved, thereby enhancing the read-out speed.

Thus, the invention described herein makes possible the advantage of providing a semiconductor memory device which can successively and rapidly output a large amount of data.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described with an illustrative example referring to the accompanying figures.

Figure 1:
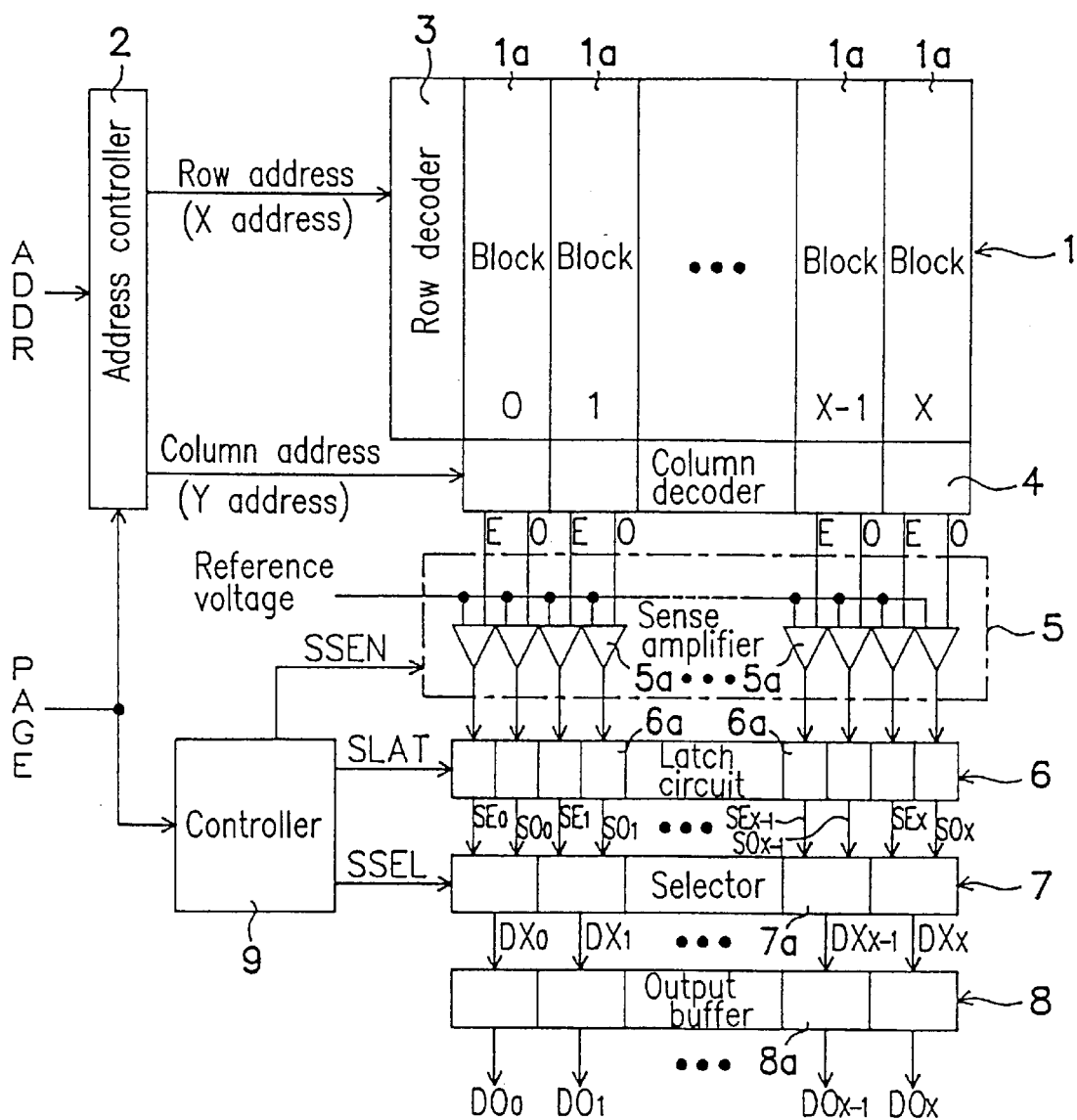
FIG. 1 is a block diagram showing a configuration of a semiconductor memory device according to an example of the present invention.
Figure 2:
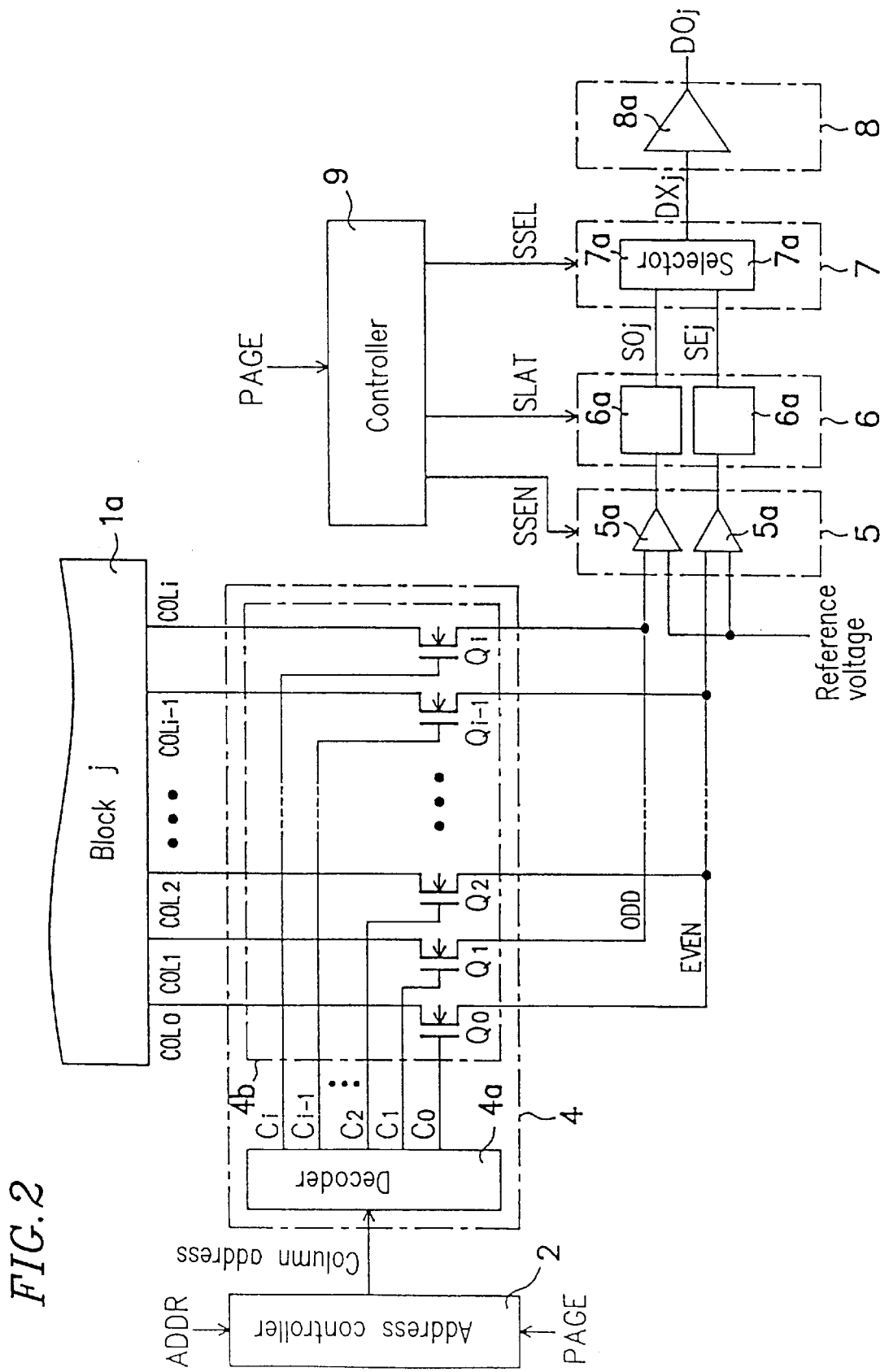
FIG. 2 is a lower level block diagram showing a configuration of one block of the semiconductor memory device according to the example of the present invention.
Figure 3:
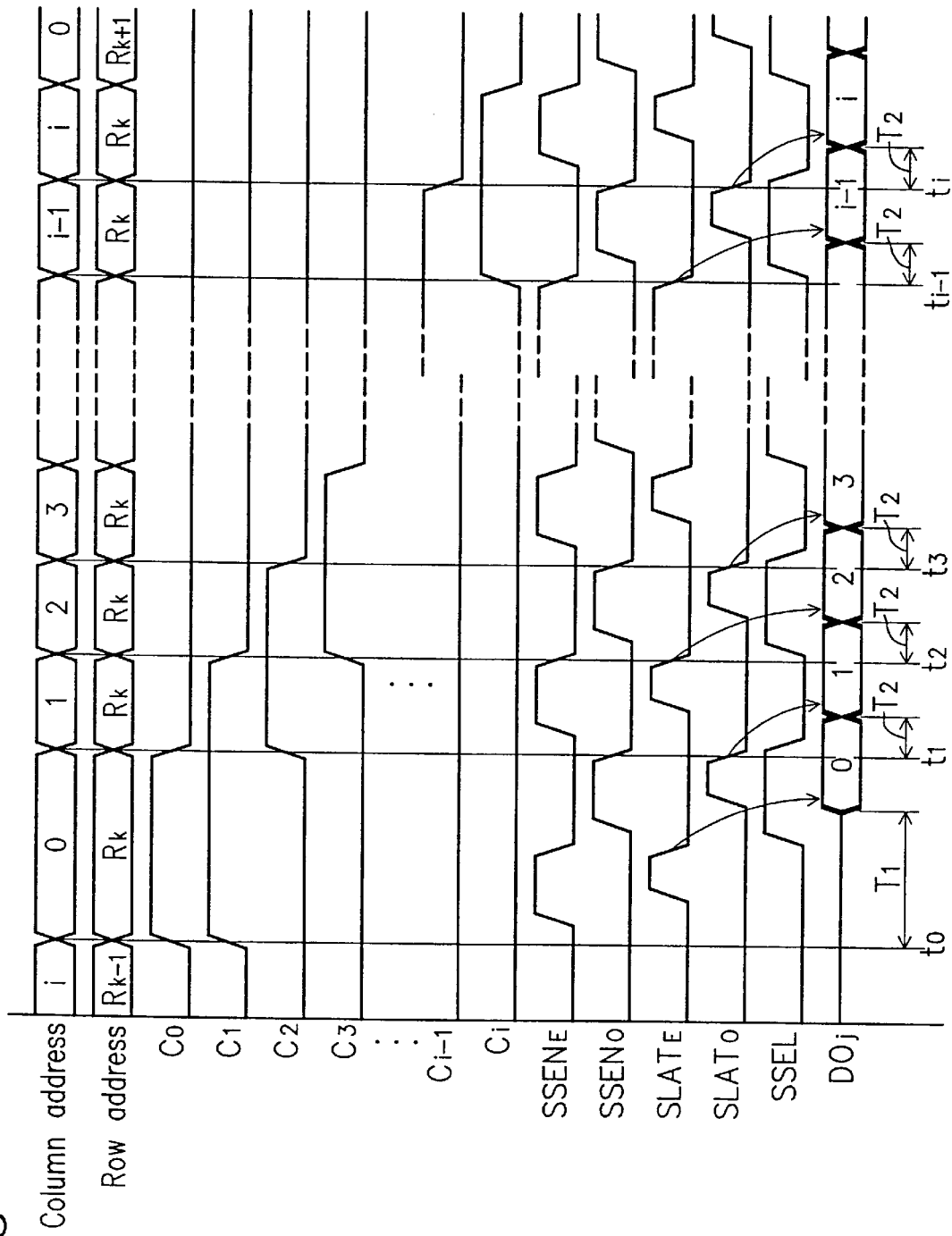
FIG. 3 is a timing diagram for illustrating the operation of the semiconductor memory device according to the example of the present invention.

FIGS. 1 to 3 are views for illustrating an example of the present invention, where FIG. 1 is a block diagram showing a configuration of a semiconductor memory device of the present invention; FIG. 2 is a block diagram showing a configuration of a bit block in the semiconductor memory device of FIG. 1; and FIG. 3 is a timing diagram for illustrating the operation of the semiconductor memory device of FIG. 1.

A semiconductor memory device of the present example has a memory cell array divided into a number X+1 of bit blocks 1a (as bit blocks 0 to X). Each bit block 1a includes bit lines (columns) each belonging to either an even-numbered bit line group or an odd-numbered bit line group.

An address data ADDR from outside the memory device is input to an address controller 2 where the address data ADDR is divided into two sets of address data corresponding to a row address (X address) and a column address (Y address). The row address is transmitted to a row decoder 3 provided commonly for all the bit blocks 1a, and the column address is transmitted to a column decoder 4 provided for each bit block 1a. The row decoder 3 is a circuit which designates a row over all the bit blocks 1a based on the row address so that data stored in memory cells on the designated row is read out to the bit lines corresponding to the memory cells.

As shown in FIG. 2, the column decoder 4 of each bit block 1a includes a decoder 4a and a bit line selection circuit 4b. The decoder 4a is a circuit for decoding the column address from the address controller 2 so as to successively activate the number i+1 of column selection lines C0 to Ci through pipeline processing. The activated column selection line C0 to Ci activates a gate of a corresponding transistor Q0 to Qi so that the transistor Q0 to Qi is turned on. A bit line COL0 to COLi corresponding to the activated transistor Q0 to Qi is connected to either an even-numbered data line EVEN or an odd-numbered data line ODD by the bit line selection circuit 4b. The bit line selection circuit 4b is designed to connect even-numbered bit lines COL0, COL2, . . . to the even-numbered data line EVEN and odd-numbered bit lines COL1, COL3, . . . to the odd-numbered data line ODD.

The even-numbered data line EVEN and the odd-numbered data line ODD are to receive outputs of the column decoder 4 of each bit block 1a. Each of the data lines EVEN and ODD is connected to one of sense amplifiers 5a of a sense amplifier group 5. The sense amplifier group 5 includes two sense amplifiers 5a (e.g, one for the even-numbered data line EVEN and the other for the odd-numbered data line ODD) for each bit block 1a. Accordingly, the total number of the sense amplifiers 5a included in the entire memory device is 2(X+1). Each sense amplifier 5a is a differential amplifier which compares data read out to the data lines EVEN and ODD with a reference voltage so as to sense data. The data is read out to the data lines EVEN and ODD via the bit lines COL0 to COLi and the bit line selection circuit 4b.

The data sensed by the sense amplifiers 5a of the sense amplifier group 5 is then latched by the number 2(X+1) of latch circuits 6a of a latch circuit group 6. The data latched by the latch circuits 6a of the latch circuit group 6 is then transmitted to the number X+1 of selectors 7a of a selector group 7.

For example, two bits of data are read out from one bit block 1a "j" (j is an integral number in the range of 0 to X), and latched by the two latch circuits 6a. Two output signals SEj and SOj from the two latch circuits 6a are to be input to one selector 7a. The selector 7a is a selection circuit which selects either one of the signals SEj or SOj of the two latch circuits 6a and outputs the selected signal SEj or SOj as a signal DXj. The signal DXj (one of the output signals $DX_0$ to $DX_x$ in FIG. 1) output from the selector 7a of the selector group 7 is then output through one of the number X+1 of output buffers 8a of an output buffer group 8 as a signal DOj (one of the output signals $DO_0$ to $DO_x$ in FIG. 1).

The timing of sensing of each sense amplifier 5a of the sense amplifier group 5, the timing of latching of each latch circuit 6a of the latch circuit group 6, and the timing of selecting of each selector 7a of the selector group 7 are respectively controlled by a sense signal SSEN, a latch signal SLAT, and a selection signal SSEL output from a controller 9. The controller 9 is a control circuit which determines whether the memory device is operating in the rapid read-out mode or in the normal read-out mode based on a rapid read-out mode signal PAGE or the like, and controls the timings at which each of the sense amplifier group 5, the latch circuit group 6, and selector group 7 operates, in accordance with the mode in which the memory device is operating.

During the normal read-out mode operation, either the even-numbered sense amplifier 5a or the odd-numbered sense amplifier 5a senses data, depending on whether the data is read out to the even-numbered data line EVEN or the odd-numbered data line ODD. Once the sense amplifier 5a of the group (i.e., the even-numbered group or the odd-numbered group) completes sensing the data, the data is latched by the latch circuit 6a of the same group, and the selector 7a of the selector group 7 switches its selection to the output of the latch circuit 6a of the group which latched the data.

During the rapid read-out mode operation, data is first sensed by the even-numbered sense amplifiers 5a of the sense amplifier group 5, for example. Once the even-numbered sense amplifiers 5a complete sensing the data, the data is latched by the even-numbered latch circuits 6a of the latch circuit group 6, and the selectors 7a of the selector group 7 switch the selections to the outputs of the even-numbered latch circuits 6a. While the data latched by the even-numbered latch circuits 6a is being output via the selectors 7a and the output buffers 8a of the output buffer group 8, the other bits of the data are sensed by the odd-numbered sense amplifiers 5a of the sense amplifier group 5. Once the odd-numbered sense amplifiers 5a complete sensing the data, the data is latched by the odd-numbered latch circuits 6a of the latch circuit group 6. The column address is then altered to the next so that the selectors 7a of the selector group 7 switch the selections to the outputs of the odd-numbered latch circuits 6a. The same operation will be repeated alternately for the even-numbered circuits and the odd-numbered circuits.

The rapid read-out mode operation of the semiconductor memory device will now be described with reference to FIG. 3. It is assumed that, at time t0, a row address Rk is determined to designate one row for all the bit blocks 1a, and a column address is determined to designate address 0 of each bit block 1a. The column decoder 4 activates (to H level) two column selection lines C0 and C1 of the decoder 4a so that the bit line COL0 corresponding to address 0 is selected and connected to the even-numbered data line EVEN, and the bit line COL1 corresponding to the next address 1 is selected and connected to the odd-numbered data line ODD. Then, a sense signal $SSEN_E$ for activating the even-numbered sense amplifiers 5a of the sense amplifier group 5 is activated (to H level) so that data read out to the bit line COL0 is sensed.

Then, once the sense amplifier 5a completes sensing the data, a latch signal $SLAT_E$ for activating the even-numbered latch circuits 6a of the latch circuit group 6 is activated so that the data is latched and, at the same time, the selection signal SSEL is turned to H level so that the selector 7a of the selector group 7 switches the selection to the output of the even-numbered latch circuit 6a. Then, with a short time lag after the activation of the selection signal SSEL, the data from address 0 is output through the output buffer 8a of the output buffer group 8 as the output DOj.

When the sense signal $SSEN_E$ is deactivated (to L level), a sense signal $SSEN_O$ for activating the odd-numbered sense amplifiers 5a of the sense amplifier group 5 is activated (to H level) so that data read out to the bit line COL1 is sensed. Once the sense amplifier 5a completes sensing the data, a latch signal $SLAT_O$ for activating the odd-numbered latch circuits 6a of the latch circuit group 6 is activated so that the data is latched. When the column address is altered to designate address 1 at time t1, the selection signal SSEL is turned to L level so that the selector 7a switches the selection to the output of the odd-numbered latch circuit 6a. Then, with a short time lag after the deactivation of the selection signal SSEL, the data from address 1 is output through the output buffer 8a of the output buffer group 8 as the output DOj.

When the column address is altered to designate address 1 at time t1, the column decoder 4 deactivates the column selection line C0 of the decoder 4a (to L level), and activates the column selection line C2 while maintaining the column selection line C1 active (H level), so that the even-numbered data line EVEN is connected to the bit line COL2 which corresponds to address 2. The sense signal $SSEN_E$ is activated (to H level) so that the data read out to the bit line COL2 is sensed. Once the sense amplifier 5a completes sensing the data, the latch signal $SLAT_E$ is activated so that the data is latched by the even-numbered latch circuit 6a. When the column address is altered to designate address 2 at time t2, the selection signal SSEL is again turned to H level so that the selector 7a switches the selection to the output of the even-numbered latch circuit 6a. Then, with a short time lag after the activation of the selection signal SSEL, the data from address 2 is output through the output buffer 8a of the output buffer group 8 as the output DOj.

The column address is successively altered as described above until the column address designates address i, so as to successively select the number i+1 of the bit lines COL0 to COL1 of each bit block 1a. The period of time during which one bit line is being selected partially overlaps that of the next bit line. Therefore, by alternately operating the two sense amplifiers 5a, it is possible to sense successively and in parallel, and read out data which is read out to the bit lines COL0 to COLi from address 0 to address i. It requires a relatively long period of time as is shown by T1 to output the data from address 0 after being designated by the corresponding column address at time t0. However, it only requires a relatively short period of time as is shown by T2 to output data from the subsequent addresses 1, 2, . . . i after being designated by the corresponding column addresses at times t1, t2, . . . ti. Thus, it is possible to realize the rapid read-out operation.

As described above, according to the semiconductor memory device of the present example, when a column address is determined with the rapid read-out mode signal PAGE being active, the column decoder 4 always selects bit lines in such a manner that the period of time during which the bit line corresponding to the selected address is being selected at least partially overlaps that of the bit line corresponding to the next address. Moreover, the even-numbered sense amplifier 5a and the odd-numbered sense amplifier 5a are alternately operated to sense data. Therefore, while a bit of data is being output, the next bit of the data can be sensed. Thus, the second and subsequent bits of data can be rapidly read out by saving the period of time required for sensing these bits of the data through pipeline processing. Moreover, since only two sense amplifiers 5a are sufficient for each bit block 1a, and the two sense amplifiers 5a are alternately operated, the circuit scale can be minimized while the number of the sense amplifiers 5a functioning at the same time is also minimized, thereby resulting in low power consumption.

Figure 4:
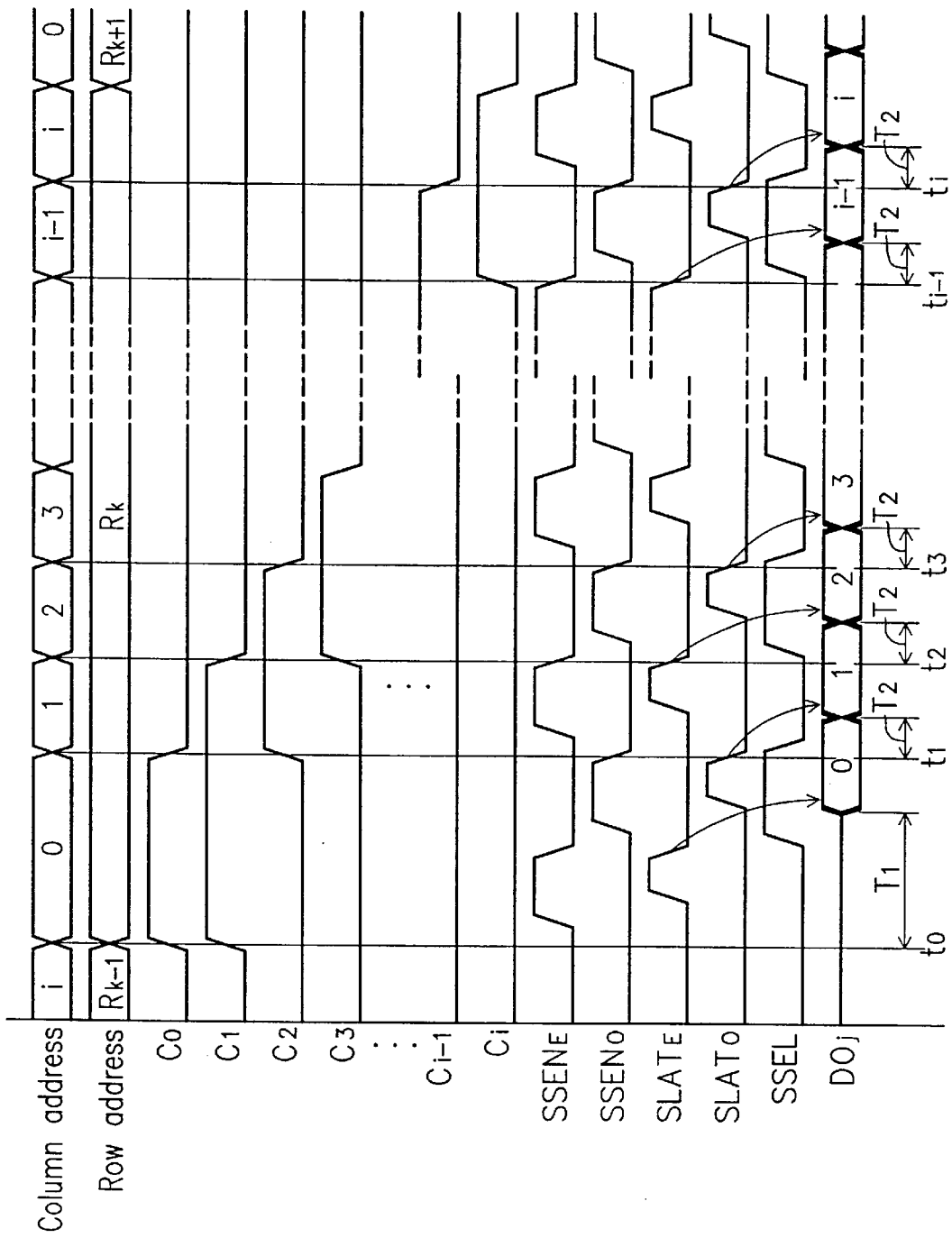
FIG. 4 is another timing diagram for illustrating the operation of the semiconductor memory device according to the example of the present invention.
Figure 5:
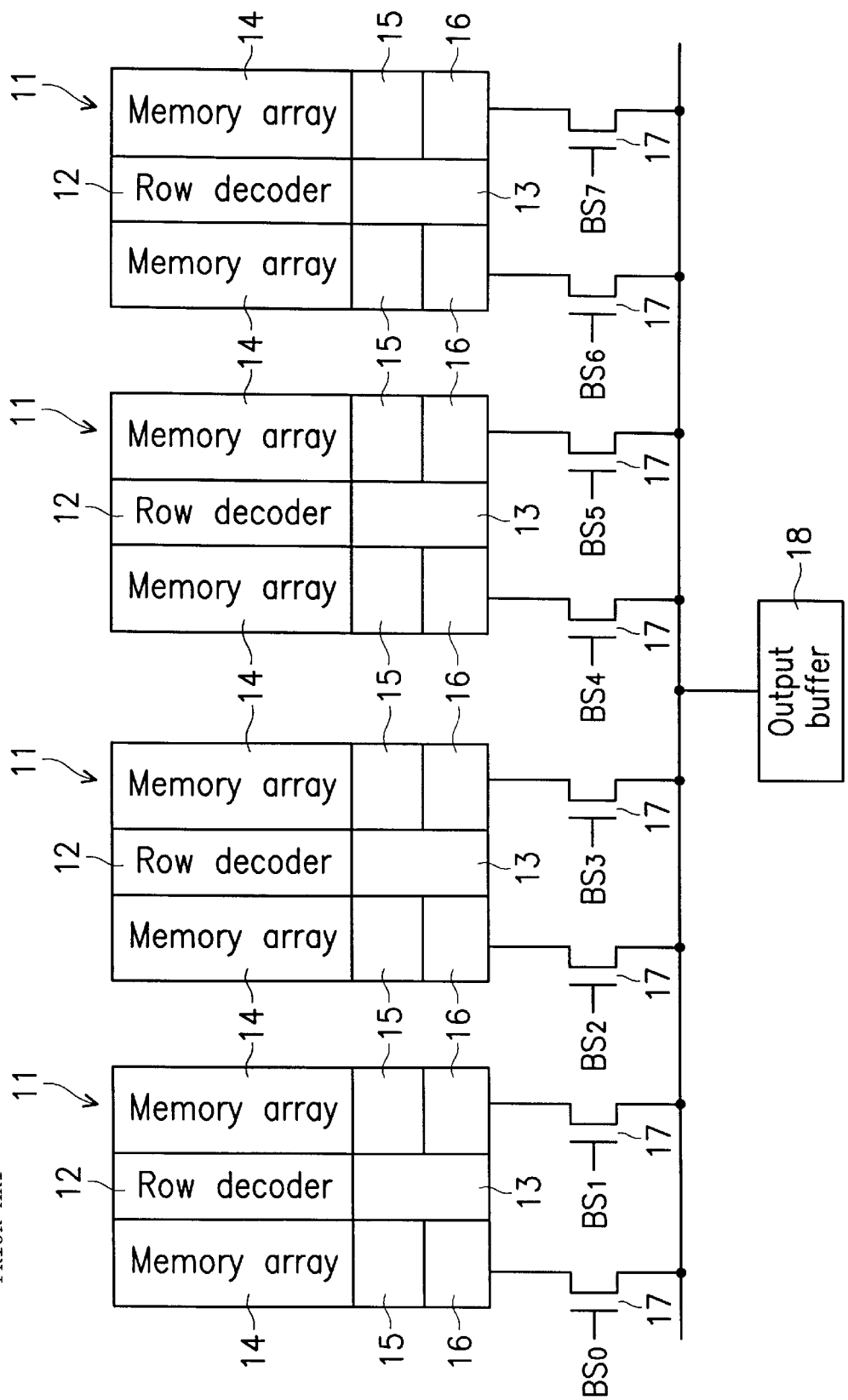
FIG. 5 is a block diagram showing a configuration of a conventional semiconductor memory device.
Figure 6:
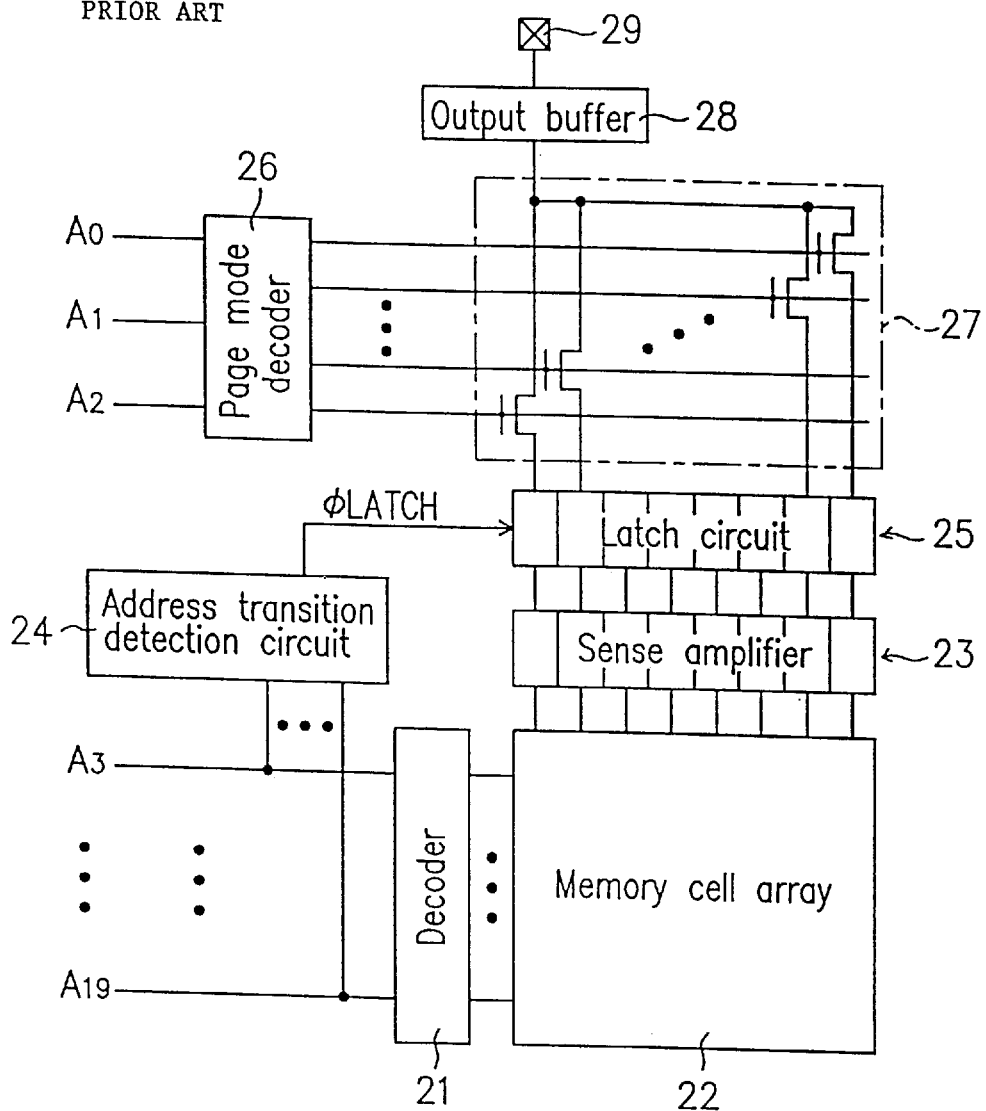
FIG. 6 is a block diagram showing a configuration of another conventional semiconductor memory device.
Figure 7:
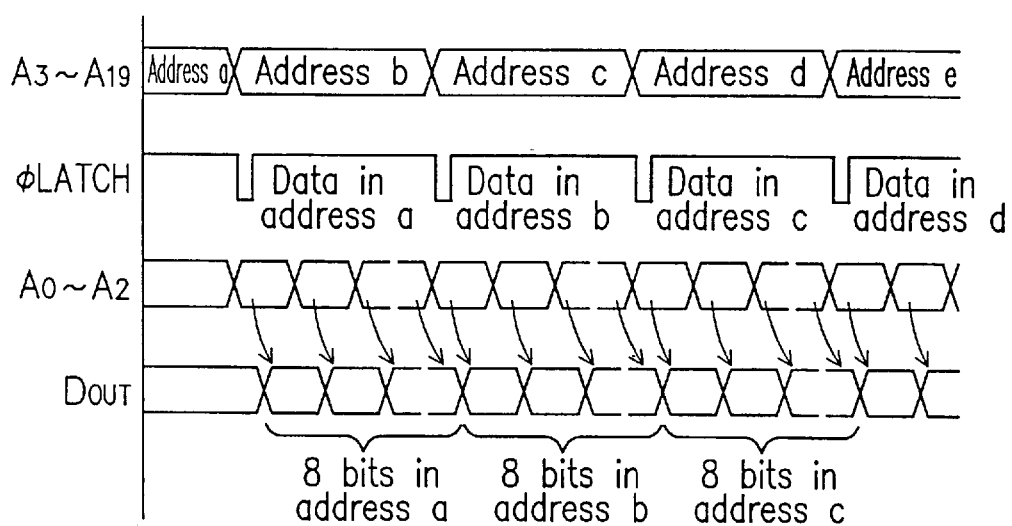
FIG. 7 is a timing diagram for illustrating the operation of the semiconductor memory device of FIG. 6.

In the present example, the row address Rk is repeatedly designated for i+1 times (each time when the column address is altered to designate address 0, 1, . . . i). After all the addresses 0, 1, . . . i are designated for the row address Rk, the row address Rk+1 is then repeatedly designated for i+1 times while addresses 0, 1, . . . i are successively designated. However, the operation timings of the semiconductor memory device are not limited to the above-described example. For example, as shown in FIG. 4, the row decoder 3 of the above example can maintain the selection of the row address Rk for the bit blocks 1a, while data is successively and rapidly output by successively altering the column address. Specifically, the number i+1 of the bit lines COL0 to COLi of each bit block 1a are each connected to a memory cell via a switching element. Therefore, control terminals of all the switching elements on the row designated by the row address Rk can be held active (e.g., H level) by the row decoder 3. In such a case, the read-out operation can be further simplified.

In the case of a semiconductor memory device such as a DRAM (Dynamic Random Access Memory) where data stored in a memory cell is read out by a destructive read-out operation, it is normally required that all the bit lines COL0 to COLi be already precharged at the beginning of the rapid read-out operation. On the other hand, in the case of a semiconductor memory device such as a mask ROM (Read-Only Memory), bit lines can be precharged with the row of the bit lines being selected. Therefore, it is possible to precharge the bit lines COL0 to COLi immediately before data is sensed. Moreover, the precharge operation can be performed even before the address corresponding to the bit line COL0 to COLi is designated by the corresponding column address. In the case where the precharge operation is performed in an even earlier stage as above, data can be even more rapidly output than the case where the bit lines are precharged after the bit lines are designated by the corresponding column address.

Although two sense amplifiers 5a (for the even-numbered bit line group and the odd-numbered bit line group) are provided for each bit block 1a in the abovedescribed example, each bit block 1a may include three or more bit line groups and three or more sense amplifiers 5a corresponding to the bit line groups. Also in such a case, the sense amplifiers 5a are alternately operated.

As described above, according to the semiconductor memory device of the present invention, the number N (two or more) of sense amplifiers are alternately used. Therefore, data on more than N bit lines can be sensed and output by sensing the data while outputting the preceding data. Accordingly, it is possible to realize a rapid read-out operation without making the scale of the circuit larger than necessary, thereby also lowering the cost of the device incorporating such a semiconductor memory device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a memory cell array including a plurality of bit blocks each including a plurality of bit line groups each including a plurality of bit lines;
   a row decoder for designating a row over the plurality of bit blocks based on a row address so that data stored in memory cells on the designated row is read out to bit lines corresponding to the memory cells;

a column decoder for alternately designating a plurality of the bit lines corresponding to the memory cells on the designated row, each belonging to a different one of the bit line groups for each of the bit blocks based on a column address while the row decoder maintains the designation of the row over the plurality of bit blocks based on the row address;

a plurality of sense amplifiers each provided for one of the plurality of bit line groups for sensing and amplifying data on the designated bit lines;

a plurality of latch circuits each provided for one of the plurality of sense amplifiers for latching outputs of the plurality of sense amplifiers; and a selector for alternately selecting one of outputs of the plurality of latch circuits corresponding to different bit line groups, thereby rapidly outputting the data;

a controller for alternately operating one of the plurality of sense amplifiers corresponding to different bit line groups.

2. A semiconductor memory device according to claim 1, wherein while the sense amplifiers sense the data on the bit line designated by the column decoder, the bit lines belonging to the bit line group which is not the bit line group to which the designated bit line belongs are precharged.

3. A semiconductor memory device according to claim 1, wherein while the sense amplifiers sense the data on the bit line designated by the column decoder, the bit lines belonging to the bit line group which is not the bit line group to which the designated bit line belongs are precharged.

4. A semiconductor memory device according to claim 1, wherein the plurality of bit line groups include an even-numbered bit line group and an odd-numbered bit line group.

5. A semiconductor memory device comprising:

a memory cell array including a plurality of bit blocks each including a plurality of bit line groups each including a plurality of bit lines;

a row decoder for designating a row over the plurality of bit blocks based on a row address so that data stored in memory cells on the designated row is read out to bit lines corresponding to the memory cells;

a column decoder for alternately designating a plurality of the bit lines each belonging to different one of the bit line groups for each of the bit blocks based on a column address while the row decoder maintains the designation of the row over the plurality of bit blocks based on the row address;

a plurality of sense amplifiers each provided for one of the plurality of bit line groups for sensing and amplifying data on the designated bit lines;

a plurality of latch circuits each provided for one of the plurality of sense amplifiers for latching outputs of the plurality of sense amplifiers; and a selector for alternately selecting one of outputs of the plurality of latch circuits corresponding to different bit line groups, thereby rapidly outputting the data;

wherein the plurality of bit line groups include an even-numbered bit line group and an odd-numbered bit line group;

the plurality of sense amplifiers include a plurality of first sense amplifiers each provided for the odd-numbered bit line groups for sensing and amplifying data on the designated bit lines, and a plurality of second sense amplifiers each provided for the even-numbered bit line groups for sensing and amplifying data on the designated bit lines;

the first sense amplifiers sensing the data on the bit lines belonging to the odd-numbered bit line group, while the second sense amplifiers do not sense the data on the bit lines belonging to the even-numbered bit line group;

the second sense amplifiers sensing the data on the bit lines belonging to the even-numbered bit line group, while the first sense amplifiers do not sense the data on the bit lines belonging to the odd-numbered bit line group.

* * * * *